US005760438A

United States Patent [19]

Sethi et al.

[11] Patent Number: 5,760,438
[45] Date of Patent: Jun. 2, 1998

[54] HIGH SPEED FLASH MEMORY CELL STRUCTURE AND METHOD

[75] Inventors: Rakesh Balraj Sethi, Campbell; Christopher S. Norris, Morgan Hill; Genda J. Hu, Sunnyvale, all of Calif.

[73] Assignee: Cypress Semiconductor Corporation, San Jose, Calif.

[21] Appl. No.: 800,656

[22] Filed: Feb. 4, 1997

Related U.S. Application Data

[63] Continuation of Ser. No. 452,217, May 26, 1995, Pat. No. 5,648,669.
[51] Int. Cl.$^6$ ............................................. H01L 29/788
[52] U.S. Cl. ........................... 257/317; 257/318; 257/321; 257/324
[58] Field of Search .................................. 257/315, 316, 257/317, 318, 321, 324

[56] References Cited

U.S. PATENT DOCUMENTS

| | | | |
|---|---|---|---|
| 4,503,524 | 3/1985 | McElroy | 365/218 |
| 4,615,020 | 9/1986 | Rinerson et al. | 365/184 |
| 4,642,881 | 2/1987 | Matsukawa et al. | 29/576 |
| 4,804,637 | 2/1989 | Smayling et al. | 437/52 |
| 4,822,750 | 4/1989 | Perlegos et al. | 437/52 |
| 4,870,304 | 9/1989 | Bloker et al. | 307/468 |
| 4,958,321 | 9/1990 | Chang | 365/185 |
| 5,005,155 | 4/1991 | Radjy et al. | 365/185 |
| 5,016,215 | 5/1991 | Tigelaar | 365/185 |
| 5,077,691 | 12/1991 | Haddad et al. | 365/218 |
| 5,151,375 | 9/1992 | Kazerounian et al. | 437/43 |

(List continued on next page.)

OTHER PUBLICATIONS

H. Onoda et al., A Novel Cell Structure Suitable For a 3 Volt Operation, Sector Erase Flash Memory, 1992,pp. 599–602.
Sze, Semiconductor Devices Physics and Technology, 1985, pp. 100–108 and 470–491.
Yang, Fundamentals of Semiconductor Devices, 1978, pp. 98–105, 114–121 and 284–294.
Messmer, The Indispensable PC Hardware Book, 1994, pp. 331–341.
Ong, Modern MOS Technology: Processes, Devices and Design, 1984, pp. 210–222.

Primary Examiner—Ngân V. Ngô
Attorney, Agent, or Firm—Bliss McGlynn, P.C.

[57] ABSTRACT

A fast, fieldless flash memory cell includes an erase node having a control gate and a floating gate, both formed of polycrystalline silicon, a program transistor sharing the floating gate and control gate with the erase node, and a read transistor sharing the floating gate and control gate with the erase node and program transistor. The inventive memory cell is suitable for use in fast Programmable Logic Devices (PLDs) in the sub 5 nS range (2–5 nS), and other logic and memory parts. The erase node includes a buried N+ drain region in a P-type substrate, a buried implant plate doped N-type adjacent the drain region in the substrate, a tunnel oxide disposed over at least a portion of the plate and the drain region, the tunnel oxide extending into and abutting a gate oxide region, and thence to a field oxide region in a relaxed fashion, a polycrystalline silicon floating gate disposed over the field oxide, gate oxide, and tunnel oxide regions, a sandwich of ONO on the floating gate, and a polycrystalline silicon control gate (poly 2) disposed on the ONO. Programming occurs through the programming transistor. Reading occurs through a read path including the read transistor. During programming, coupling is improved at the gate of the programming transistor by an erase node boosting technique. This technique involves applying a relatively "boosted" voltage level to the drain region of the erase node which reduces the backbias threshold effect of erase node capacitors. Similarly, during a read operation, a relatively "boosted" voltage is applied to the drain region of the erase node, which, by way of the buried implant plate, reduces the backbias threshold effect of the erase node capacitors wherein coupling at the control gate of the read transistor is improved.

20 Claims, 5 Drawing Sheets

U.S. PATENT DOCUMENTS

| | | | |
|---|---|---|---|
| 5,168,465 | 12/1992 | Harari | 257/320 |
| 5,204,835 | 4/1993 | Eitan | 365/185 |
| 5,218,568 | 6/1993 | Lin et al. | 365/185 |
| 5,258,634 | 11/1993 | Yang | 287/336 |
| 5,274,588 | 12/1993 | Manzur et al. | 365/185 |
| 5,283,758 | 2/1994 | Nakayama et al. | 365/185 |
| 5,284,786 | 2/1994 | Sethi | 437/43 |
| 5,297,081 | 3/1994 | Challa | 365/184 |
| 5,326,999 | 7/1994 | Kim et al. | 275/315 |
| 5,399,891 | 3/1995 | Yiu et al. | 257/316 |
| 5,409,854 | 4/1995 | Bergemont | 437/43 |
| 5,414,658 | 5/1995 | Challa | 365/185 |
| 5,432,740 | 7/1995 | D'Arrigo et al. | 365/185 |
| 5,467,307 | 11/1995 | D'Arrigo et al. | 365/185.06 |
| 5,475,251 | 12/1995 | Kuo et al. | 287/316 |
| 5,477,072 | 12/1995 | Goo | 257/316 |
| 5,514,890 | 5/1996 | Yang et al. | 257/321 |
| 5,554,867 | 9/1996 | Ajika et al. | 257/314 |
| 5,569,946 | 10/1996 | Hong | 257/316 |

HIGH SPEED FLASH MEMORY CELL STRUCTURE AND METHOD

This is a continuation application Ser. No. 08/452,217 filed on May 26, 1995, now U.S. Pat. No. 5,648,669.

BACKGROUND OF THE INVENTION

1. Field of the Invention

The present invention relates to integrated circuit memory devices and, more particularly, to an electrically-erasable programmable read only memory (EEPROM) storage cell having EPROM-type programming suitable for use in a programmable logic array (PLA).

2. Discussion of the Prior Art

More efficient utilization of device area in very large scale integration (VLSI) technology is a prominent objective in order to increase the density, and thus increase the number of memory cells on a semiconductor chip for reducing costs and increasing speed of operation. In particular, there has been much investigation into non-volatile memory devices (i.e., a type of memory device that retains stored data even after power to the device has been removed).

An electrically programmable ROM (EPROM) implements non-volatile storage of data using a storage transistor having a so-called floating gate. The floating gate is located between a control gate and a substrate, and (unlike the control gate) is not connected to a word, bit, or any other line; it "floats." The EPROM is programmed by having hot electrons injected into the floating gate to cause a substantial shift in the threshold voltage of the storage transistor. Under high gate an high drain voltages, electrons gain sufficient energy to jump the silicon-silicon dioxide energy barrier, penetrating the oxide and flowing to the floating gate, which is completely surrounded by oxide. The injected electrons cause a 5 to 10 volt increase in the threshold of the device, changing it from an ON to an OFF state when a nominal 5 volt read voltage is applied to the control gate. That is, if the floating gate holds electrons, it is negatively charged. The negative electric field developed by the floating gate counteracts the positive field applied on the control gate (assuming an NMOS device). Thus, an activated word line cannot generate a sufficiently strong field using the control gate to turn-on the transistor. This type of storage transistor is known in the art as a Floating gate Avalanche injection MOS (FAMOS) device. A significant problem associated with the FAMOS structure generally employed in EPROM devices is that in order to erase the data, the chip must be exposed to ultraviolet (UV) radiation to remove the charge carriers from the floating gate. In-system erasability is thus not possible with such a structure.

Electrically-erasable programmable read only memory (EEPROM) devices have been developed to overcome, to some extent, the above-mentioned problem associated with the FAMOS structure used in EPROM devices. The basic operation of a conventional FLOating-gate Tunnel OXide (FLOTOX) EEPROM memory cell is well-known. In a FLOTOX cell, the tunnel oxide, which is generally less than 100 Å thick, is formed over a portion of the drain region. The FLOTOX cell is designed such that a large fraction of the applied voltage is coupled across the tunnel oxide. Programming the FLOTOX cell requires application of a gate field $\geq$ about $10^7$ v/cm such that the well-known Fowler-Nordheim tunneling of electrons through the tunnel oxide to the floating gate will occur. Such an electric field is conventionally obtained by grounding both the source and the drain, and applying a high voltage $V_{pp}$ to the control gate of the FLOTOX transistor. The tunnelled charge shifts the threshold voltage of the transistor.

Erasing the cell is achieved by grounding the control gate, floating the source and applying a high voltage to the drain. In this case, most of the applied voltage is coupled across the tunnel oxide, but the field is reversed, resulting in tunneling of electrons from the floating gate to the drain.

FIG. 1 shows a prior art EEPROM memory cell 10, which will be used to clearly illustrate the shortcomings of the prior art. Cell 10 includes a high voltage access transistor 12, tunnel oxide 14, floating gate 16, buried control gate 18, low voltage access transistor 20, and a read transistor 22 that shares floating gate 16. Operation of cell 10 may be understood by those skilled in the art with reference to the following table:

TABLE 1

| SINGLE POLY EEPROM CELL SCHEMATIC | | | | | |
|---|---|---|---|---|---|
| | HV BL | LV BL | PA | PB | WL |
| PROGRAM | Vpp − Vth | Vcc | Vss | Vss | Vpp |
| ERASE | Vss | Vcc | Vpp | Vss | Vpp |
| READ | Vss | 2.0 | Vss | Vss | Vcc |

HV BL refers to a high voltage bit line, LV BL refers to a low voltage bit line, PA refers to phase A of a clock, PB refers to phase B of the clock, and WL refers to a word line of the cell. Cell 10 is representative of the prior art—it is a single poly design—only the floating gate 16 is of polycrystalline silicon material. As is known in the art, transistor 12 is included in cell 10 in order to isolate the tunnel oxide 14/floating gate 16 from the high voltage on HV BL when cell 10 is in an unselected state. It should be appreciated that transistor 12, in order to withstand conventional high voltages on HV BL (e.g., 15 volts), includes source and drain junctions of special design (i.e., much wider diffusion pitches). Accordingly, a memory cell having such a high voltage transistor incurs a significant size penalty and farther, is not readily amenable to scaling. Finally, due to the manner in which transistor 12 is constructed, it further suffers in terms of reliability (i.e., due to various "steps" in the oxide layers).

Another problem with the single poly EEPROM cell 10 is the use of a buried control gate, as shown at 18. Such a configuration requires a tremendous amount of device area. Finally, not unlike other prior art E²PROM memory cells using Fowler-Nordheim emission through a tunnel oxide for programming, cell 10 is characterized by a relatively slow (e. g., 10 milliseconds) programming speed.

Accordingly, there is a need to provide an improved memory structure suitable for use in a memory device, such as a flash memory device, that minimizes or eliminates one or more of the problems as set forth above.

SUMMARY OF THE INVENTION

This invention generally provides a memory structure of the type suitable for use in an electrically-erasable non-volatile memory cell, such as a flash memory cell. A structure in accordance with this invention offers high speed due to a 50% increase in read current over known EEPROM cells in programmable logic device (PLD) products, while having the further advantage of a cell size reduced by 50%, as compared with conventional cell designs. These improvements are achieved by implementation of an erase node boosting scheme, which is used to increase gate coupling during a program mode and a read mode.

A device in accordance with this invention includes a semiconductor substrate of a first conductivity type, preferably P-type silicon. An erase node is provided in the device that includes a buried implant plate formed in the substrate having a second conductivity type opposite the first conductivity type, preferably doped n-type, and a drain region, preferably n+, formed in the substrate adjacent to the buried implant plate. A layer of dielectric material, preferably silicon dioxide, is disposed over the substrate, including the plate/drain region. The layer of dielectric material includes a tunnel dielectric region extending over at least portion of the buried plate and the drain region. Preferably, the tunnel dielectric region is about 90–110 Å thick. A floating gate of a first conductive material, preferably lightly doped polycrystalline silicon material, is disposed on the layer of dielectric material and includes a portion extending over the tunnel dielectric region. A layer of second dielectric material is further disposed on the floating gate, and may be any relatively high dielectric constant material; preferably a sandwich of oxide/nitride/oxide (ONO). Finally, the structure includes a control gate of a second conductive material, preferably heavily doped polycrystalline silicon material, formed on the layer of ONO. In the preferred embodiment, the layer of first dielectric material includes a gate dielectric region abutting and extending from the tunnel dielectric region. This FIELDLESS design (no FIELD oxide abutting the tunnel oxide) of the erase node provides significantly improved endurance characteristics (i.e., the number of erase cycles) over the prior art. In an alternate embodiment, a FIELD oxide design is employed where the layer of first dielectric material includes a field oxide region abutting and extending from the tunnel oxide region.

The structure in accordance with the present invention may be versatilely used in connection with a variety of memory cell designs through the sharing of its floating gate with separate program and read paths. A common aspect of the structure's operation, however, relates to the application of a "boosted" voltage to the drain region, relative to conventional designs, during program and read operations. During a program operation, the program coupling seen at the control gate of a program transistor sharing the floating gate with the erase node structure is significantly improved. This improvement is realized because of the reduced backbias threshold effect on erase node capacitors due to the "boosted" voltage applied to the erase node drain. Likewise, during the read mode, the read coupling seen at the control gate of a read transistor sharing the floating gate with the inventive erase node structure is also improved because of the reduced backbias threshold effect.

In another aspect of this invention, a memory cell for storing binary data having two possible states suitable for use in a programmable logic array (PLA) is provided. A memory cell in accordance with the present invention includes separate read and programming paths coupled to the above-described erase node structure by way of a common floating gate. In the preferred embodiment, the read path includes an EPROM read transistor sharing the floating gate, which is formed of polycrystalline silicon material chargeable to correspond to one of two possible states, and a control gate coupled to an input term, also formed of polycrystalline silicon material. The EPROM read transistor further including first source and drain regions forming a first channel therebetween. The read path also includes a low voltage pass gate transistor having second source and drain regions forming a second channel therebetween. The EPROM read transistor and the low voltage pass gate transistor are connected such that the first and second channels form the read path. A read product (RPT) term line is coupled to the source of the pass gate, and the drain of the EPROM read transistor is connected to virtual ground (VGND). The read path is provided for carrying a current during the read mode that is indicative of the state of the memory cell.

The separate program path includes an EPROM program transistor that shares the floating gate and the control gate with the EPROM read transistor and the erase node. EPROM program transistor is provided for charging the floating gate using channel hot electron programming during a programming mode to thereby alter the state of the memory cell. The erase node structure in this preferred memory cell configuration is provided for erasing the cell by removing charge from the floating gate through the tunnel dielectric region.

In this preferred memory cell configuration, programming of the cell occurs through the EPROM program transistor and reading of the cell occurs through the EPROM read transistor to thereby isolate program and read paths for speed optimization. Further, programming speed is significantly enhanced by the use of a FAMOS EPROM program transistor. Moreover, both the read and program coupling is enhanced by application of relatively increased drain voltage at the drain of the erase node to improve read and program coupling. This improved coupling occurs in connection with the buried implant plate portion of the erase node. Particularly, the dielectric (oxide) under the floating gate in the erase node region is seen as a capacitance (i.e., erase node capacitors) at the control gates of both the EPROM read and EPROM program transistors. Through the implant plate, the higher voltage applied at the drain during programming and reading reduces the backbias threshold effect of the erase node capacitors. Reducing this effect improves the coupling at both the program and read transistors.

The preferred embodiment is a double poly cell (control gate and floating gate are poly), and therefore does not exhibit the significant device area penalties incurred by prior art single poly cells, such as cell 10, that use a buried (well) control gates. Furthermore, the preferred memory cell embodiment, due to the erase node boosting scheme, does not require a high voltage access transistor since the increased coupling reduces the magnitude of the voltage required; accordingly, a memory cell in accordance with this invention does not incur the device area penalty, and reliability disadvantages inherently associated with conventional memory cells designs using a high voltage access transistor, such as discussed in The Background section in connection with cell 10.

In a third aspect of this invention, a method of forming a memory cell structure in a semiconductor substrate having a first conductivity type is provided. The method is comprised of six basic steps. The first step involves forming a buried implant plate having a second conductivity type (preferably n-type) in the semiconductor substrate. The second step relates to forming a layer of first dielectric material over the semiconductor substrate, including a tunnel dielectric region formed over at least a portion of the buried implant plate such that the thickness of the tunnel dielectric is less than the thickness of the remainder of the layer of dielectric material. Third, forming a floating gate on the layer of dielectric material using polycrystalline silicon including a portion extending over the tunnel dielectric region and buried implant plate. Fourth, forming a layer of second dielectric material (preferably ONO) on the floating gate. The fifth step involves forming a control gate on the layer of ONO using polycrystalline silicon material. Finally, the sixth step relates to forming a buried drain region in the semiconductor substrate having the second conductivity (preferably n+).

These and other features and objects of this invention will become apparent to one skilled in the art from the following detailed description and the accompanying drawings illustrating features of this invention by way of example.

DETAILED DESCRIPTION OF THE PREFERRED EMBODIMENTS

Figure 2:
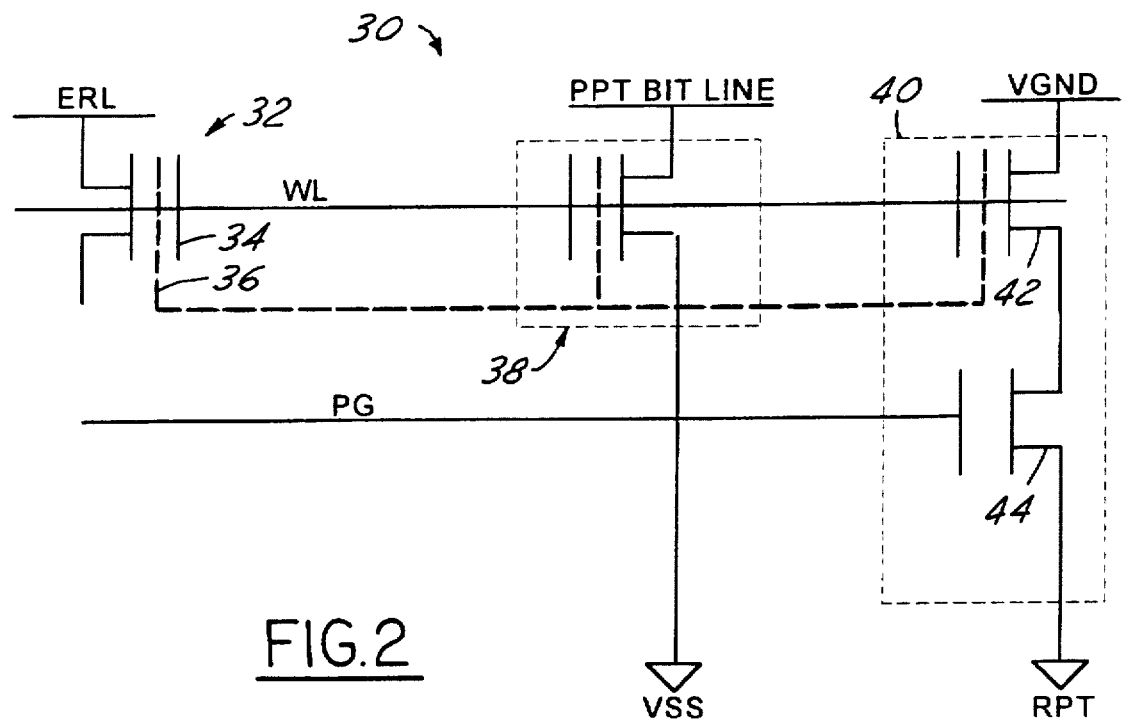
FIG. 2 is a simplified schematic diagram view of a preferred memory cell embodiment of the present invention.

Referring now to the drawings wherein like reference numerals are used to identify identical components in the various views, FIG. 2 shows a preferred memory cell embodiment in accordance with the present invention, memory cell 30. Memory cell 30 is suitable for use in fast Programmable Logic Devices (PLDs) in the sub 5 nS range (2–5 nS) and other logic and memory parts, such as embedded memory parts. Memory cell 30 includes erase node (diode) 32 having a control gate 34, and a floating gate 36, an EPROM program transistor 38, and a read path 40 comprising EPROM read transistor 42, and low voltage pass gate transistor 44. It should be understood that references to EPROM type transistors such as EPROM program transistor 38, refers merely to transistors having a FAMOS type structure.

The following abbreviations shall apply in reference with FIG. 2:

ERL = erase line,

WL = word line,

PPT bit line = program product term bit line,

VGND = virtual GND,

PG = pass gate select line, $V_{ss}$ = ground potential, and,

RPT = read product term.

Before proceeding to a detailed description of the structure of the invention, a general orientation as to the function of each major element will be set forth. Memory cell 30 is provided for storing binary data having two possible states and is suitable for use in a programmable logic array (PLA). Thus, in a configuration shown in FIG. 2, the word line WL may be an input term to the memory cell 30, while the read product term RPT may be used as an output of the cell.

Erase node 32 is preferably a diode having its drain is coupled to the erase line ERL.

Erase node 32 is provided generally for erasing cell 30 by removing charge from floating gate 34 through a tunnel dielectric by way of Fowler-Nordheim emission.

EPROM program transistor 38 preferably shares control gate 34 and floating gate 36 with erase node 32 and is provided for charging floating gate 36 during a programming mode to thereby alter the state of memory cell 30.

Read path 40 is provided for carrying a current during a read mode that is indicative of the state of the memory cell 30. EPROM read transistor 42 shares control gate 34, and floating gate 36 with erase node 32, and program EPROM transistor 38. Low voltage pass gate transistor 44 is provided in cell 30 for isolating the RPT line from the remainder of cell 30 during read operations.

Erasure of cell 30 occurs through a first path (i.e., erase node 32), programming of cell 30 occurs through a second path (i.e., program EPROM transistor 38), while the reading of cell 30 occurs through a third path (i.e., read path 40) to thereby isolate the erasure, program, and read paths for speed optimization.

A better understanding of the present invention may be obtained by way of reference to the detailed structure of the preferred embodiment. Accordingly, reference is now made to FIGS. 3–7.

Figure 1:
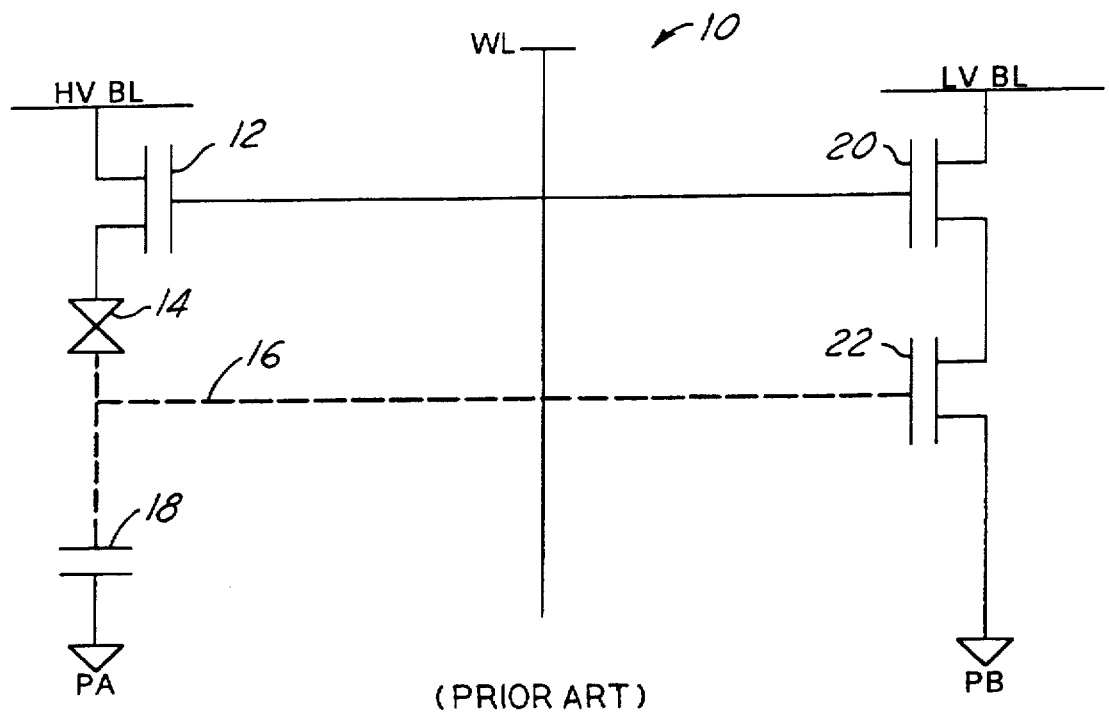
FIG. 1 is a simplified diagrammatic and schematic view of a prior art single poly EEPROM cell.
Figure 3:
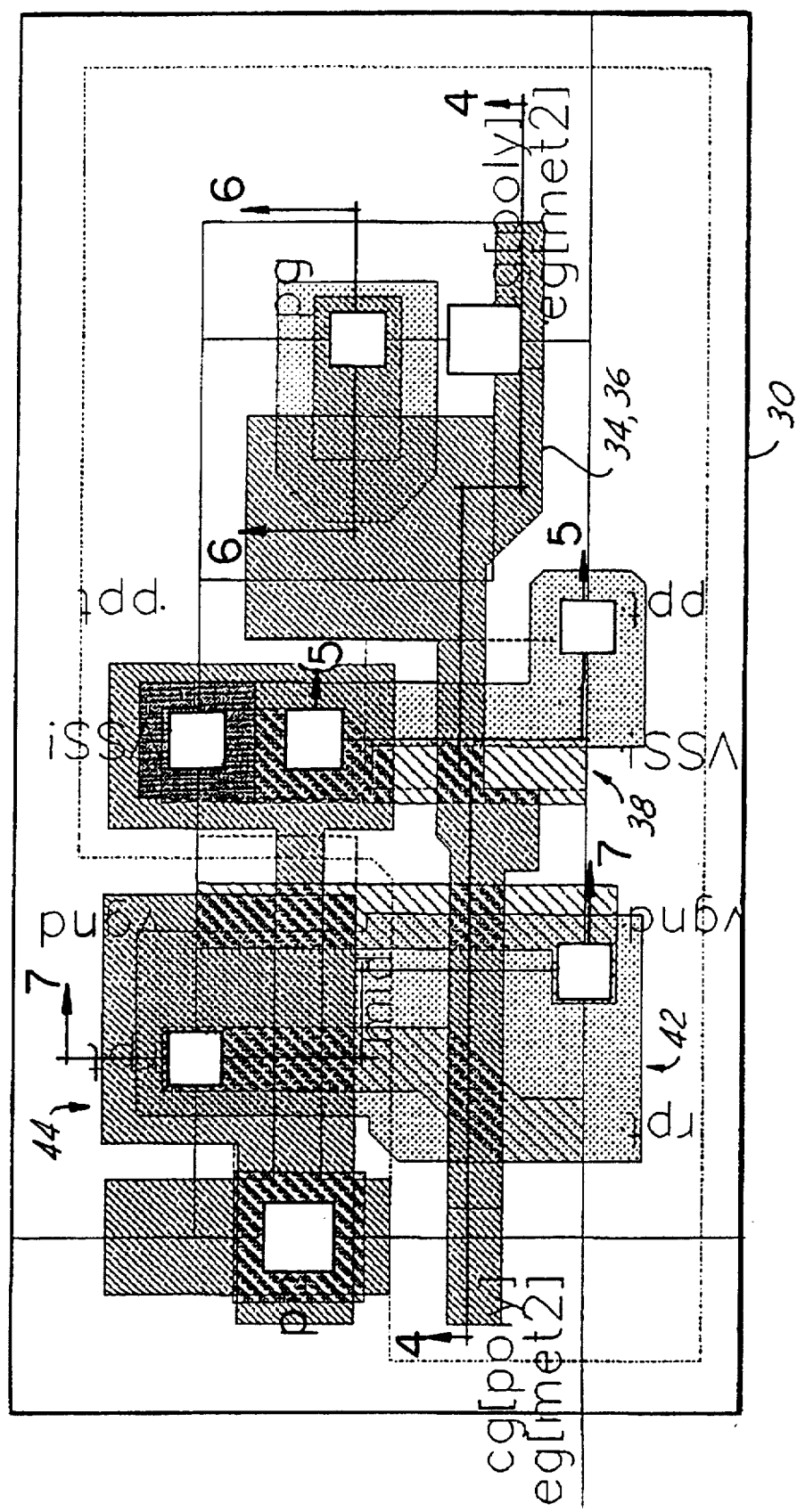
FIG. 3 is a top layout view of the semiconductor structure corresponding to the preferred memory cell embodiment shown in FIG. 2.

FIG. 3 is a top layout view of the preferred memory cell embodiment which is shown schematically in FIG. 2. FIG. 3 has been included to enable those of ordinary skill in the art to make and use the present invention, and, to provide a road map for facilitating the reader in correlating the following FIGS. 4–7. Further, for reasons that will become apparent below, the area of cell 30 is significantly reduced compared to conventional designs. The area occupied by cell 30, as shown in FIG. 3, is 5.35×12 µM, or approximately 65 sq. µM, using 0.65 µM design rules. Comparable designs, such as that of cell 10 in FIG. 1, range anywhere from 110 sq. µM to 220 sq. µM or more. This 2x–4x size reduction is extremely important for a variety of reasons that should be apparent to those skilled in the art. Further reductions in area are contemplated when cell 30 is implemented using increasingly reduced design rules (e.g., 35 sq. µM using 0.5 µM rules; 25 sq. µM using 0.35 µM rules etc.).

Figure 4:
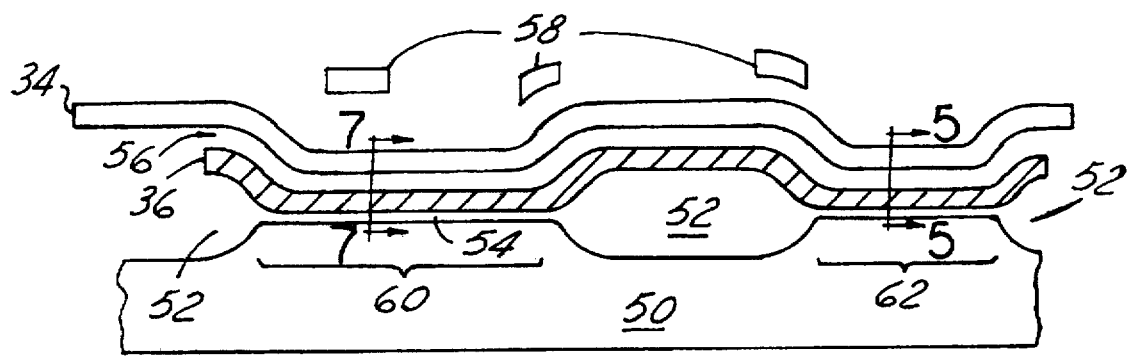
FIG. 4 is a simplified exaggerated cross-sectional view taken along line 4—4 in FIG. 3 parallel to the control gate illustrating a portion of the preferred memory cell embodiment of the present invention.

As shown in the lower half of the layout in FIG. 3, word line, or control gate 34, and floating gate 36 are stacked, aligned, and generally elongated. FIG. 4 corresponds to a section taken into the paper and parallel to control gate 34 taken along line 4—4, and viewed in the direction of the arrows.

FIG. 4 shows the general structure of a portion of the memory cell 30. In the preferred embodiment, both control gate 34, and floating gate 36 are comprised of polycrystalline silicon material; accordingly, cell 30 is a "double poly" type cell. Control gate 30 may have a thickness in the range of 1.5–3.0 KÅ, and is 3 KÅ in the preferred embodiment. Floating gate 36 may have a thickness in the range of 1.0–2.0 KÅ, and is 2 KÅ in the preferred embodiment. Control gate 34 is preferably doped n+ such that it has a sheet resistance of about 20–40 ohms per square. Floating gate 36 is preferably doped n+ such that it has a sheet resistance of about 80–150 ohms per square. Selection of an appropriate dopant, and determining the magnitude of same to obtain these resistance values requires no more than a routine of application of ordinary skill in the semiconductor fabrication field of endeavor.

Cell 30 further includes a semiconductor substrate 50 of a first conductivity type, field dielectric islands 52, gate dielectric 54, interpoly dielectric 56, bit lines 58, read channel region 60, and program channel region 62.

Substrate 50 is preferably P-type silicon, field dielectric islands 52 are preferably comprised of silicon dioxide material about 5,000 Å thick forming field oxide regions, gate dielectric 54 is silicon dioxide material that may have a thickness of about 150–225 Å and is preferably 225 Å, interpoly dielectric 56 is a sandwich of oxide/nitride/oxide (ONO), and bit lines 58 are formed of metal.

Figure 5:
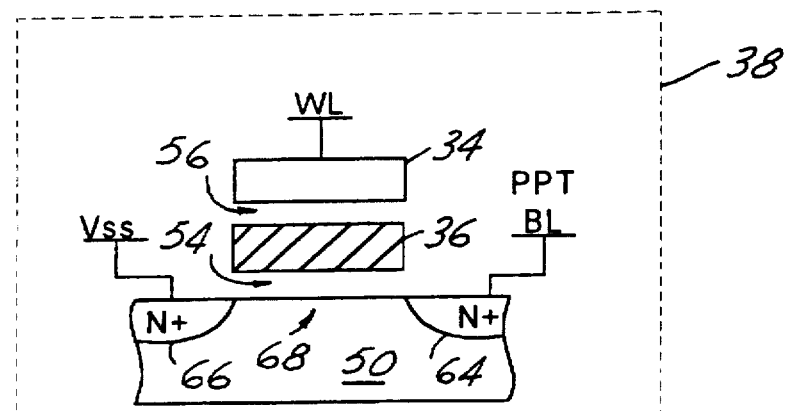
FIG. 5 is a simplified exaggerated cross-sectional view taken along line 5—5 of FIGS. 3 and 4 illustrating the FAMOS program area of the preferred memory cell embodiment of the present invention.

FIG. 5 corresponds to a section along line 5—5 in FIG. 4 and shows in greater detail the FAMOS type structure preferably employed in transistor 38. Programming transistor 38 includes program transistor gate dielectric 54', and source and drain regions 64, 66 formed in substrate 50 and spaced apart to define a substrate channel region 68 therebetween.

Dielectric 54' is preferably silicon dioxide that may have a thickness in the range of 150–225 Å, and preferably is 225 Å. Drain and source regions 64, 66 are preferably doped n+ in accordance with conventional practice. An important aspect of the present invention, which will become clearer below, is that program transistor 38, particularly the source and drain junctions, are designed for relatively low voltage operations; accordingly, much less device area is required.

Figure 6:
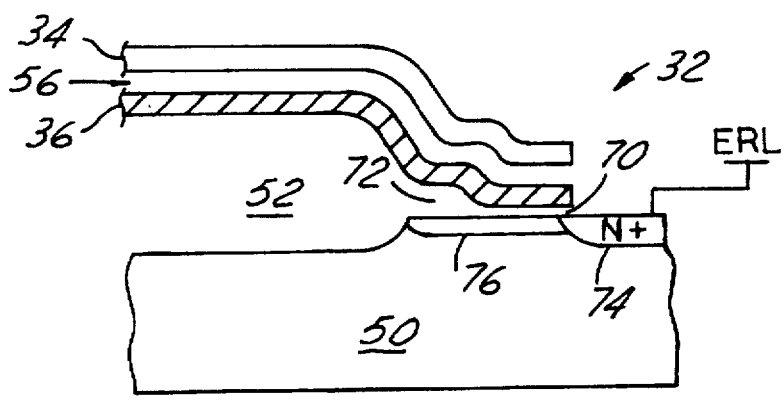
FIG. 6 is a simplified exaggerated cross-sectional view taken along line 6—6 of FIG. 3 illustrating the structure of an erase node portion of the preferred memory cell embodiment of the present invention.

FIG. 6 is a simplified, exaggerated in scale, cross-sectional view of erase node 32 taken along lines marked 6—6 in FIG. 3. Erase node 32 preferably includes tunnel dielectric 70, gate oxide 72, source/drain region 74, and buried implant plate 76.

Tunnel dielectric 70 may have a thickness in the range of about 90–110 Å, and is preferably silicon dioxide having a thickness of about 100 Å. Gate dielectric 72 is preferably silicon dioxide and may have a thickness of about 150–225 Å, and preferably is about 225 Å. Source/drain region 74 is preferably comprised of a doped region in substrate 50 having arsenic in an average concentration in the range of $10^{15}$ atoms per cubic centimeter. Buried plate 76 preferably takes the form of a buried implant plate that is doped n-type. Plate 76 is comprised of a doped region in substrate 50 having arsenic in an average concentration in the range $10^{12}$ to $10^{15}$ atoms per cubic centimeter. It should be appreciated by those of ordinary skill in the art that other N-species may be used in forming both source/drain 74, and plate 76.

There at least two important aspects related to the structure of erase node 32. The first aspect relates to the inclusion of gate oxide region 72. In the prior art, field oxide 52 abuts and forms a severe transition in thickness with tunnel oxide 70. In such conventional structures, when high electric fields are repeatedly applied during programming and erasure, the field oxide/tunnel oxide edge degrades rapidly, thus resulting in an unreliable structure. In fact, some prior art designs have an endurance of <10,000 cycles. By relaxing the transition between tunnel oxide 70 and field oxide 52 by inclusion of gate oxide 72, the resulting electric therethrough during program and erase has been correspondingly relaxed. The smoother structural transition provides a structure that has a significantly improved endurance. The preferred embodiment, including gate oxide 72, has exhibited an endurance $>1\times10^6$ cycles. Thus, this so-called FIELDLESS implementation (i.e., including gate oxide 72) is the preferred configuration; however, a FIELD oxide version of the erase node 32 (i.e., without gate oxide 72 wherein field oxide 52 abuts tunnel oxide 70) may be employed and still remain within the spirit and scope of the present invention.

The second important aspect regarding the structure of erase node 32 relates to plate 76. It should be appreciated by those skilled in the art that tunnel oxide 70, and gate oxide 72 act as capacitors (i.e., erase node capacitors) extending from floating gate 36 to plate 76/drain 74. Further, during a program mode and a read mode in conventional devices, the erase line ERL is generally grounded. Thus, for conventional devices the control gate of a read and/or program transistor sharing the floating gate sees this capacitance. Plate 76 helps improve program coupling at the control gate of EPROM program transistor 38 during programming mode, and read coupling at the control gate of read transistor 42 during a read mode, by providing a means for reducing a backbias threshold effect on these erase node capacitors. Importantly, during program and read mode, the erase line ERL is not grounded, but is rather "boosted," preferably, to a level one threshold level below the voltage applied to the gate. Therefore, during programming mode, a programming voltage $V_{pp}$ is applied to control gate 34, while a voltage value $V_{pp}-Vt$ is applied to erase line ERL. During a read mode, a read voltage $V_{cc}$ is applied to control gate 34, while $V_{cc}-Vt$ is applied to erase line ERL. By reducing the potential difference across the erase node capacitors, particularly over a large region as facilitated by plate 76, the programming coupling at the control gate of the program transistor 38 during a program mode, and the read coupling at the control gate of read transistor 42 during a read mode, respectively, is significantly improved. A further benefit from plate 76 is that the increased coupling reduces the magnitude of the voltage required for programming/erasure operations. A lower programming/erase voltage obviates the need for a high voltage access transistor in the design, which uses a significant amount of device area. The magnitude of the depletion implant used to form plate 76 is controlled to improve inversion along the surface of plate 76 during program mode, and read mode.

Figure 7:
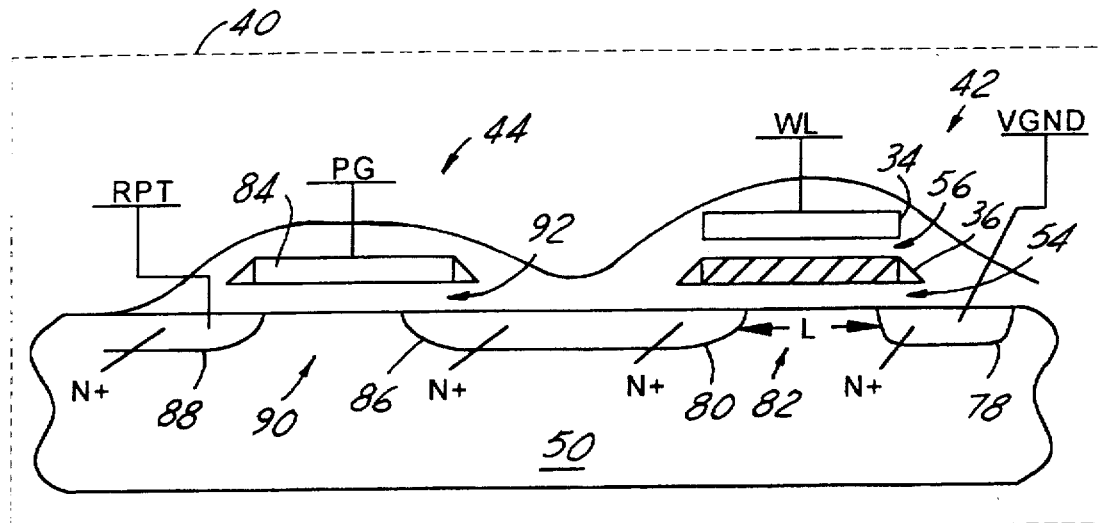
FIG. 7 is a simplified exaggerated cross-sectional view taken along line 7—7 of FIGS. 3 and 4 illustrating the structure of a read path portion of the preferred memory cell embodiment of the present invention.

FIG. 7 is a cross-section view through the structure of cell 30 taken along line 7—7 of FIGS. 3 and 4. As shown in FIG. 7, the read path 40 in the preferred embodiment includes EPROM read transistor 42, and low voltage pass gate transistor 44.

Transistor 42 includes source and drain regions 78, 80 formed in substrate 50 and being spaced apart to define a substrate channel region 82 therebetween.

Preferably, regions 78, 80 are doped n+ in accordance with conventional practice. Channel 82 preferably is formed having a W/L ratio of 3.5/0.65 realized for 0.65 micron design rules, which improves read current $I_{dsr}$ even for relatively low voltage of RPT.

Low voltage pass gate transistor 44 includes control gate 84, source and drain regions 86, 88 formed or buried in substrate 50 and being spaced apart to define a substrate channel region 90 therebetween, and low voltage (LV) gate dielectric 92.

Preferably, control gate 84 is formed using polycrystalline silicon material. As shown in FIG. 3, this is a relatively small piece of poly that results in a relatively low input gate capacitance. Drain and source regions 86, 88 are preferably doped n+ according to conventional practice. LV gate dielectric 92 is preferably silicon dioxide and may have a thickness in the range of 90–165 Å, and preferably is 165 Å thick. Source 80 is preferably formed with drain 86 to form a continuous channel. One important aspect of this invention involves the structure of low voltage pass gate 44. Unlike conventional memory cells, such as memory cell 10 shown in FIG. 1, no high voltage select transistor is needed, thus obviating the requirement to design junctions able to withstand the relatively high programming voltages used in conventional memory cell designs.

Referring now to FIGS. 2–7, a description of the operation of the preferred cell embodiment 30, shown schematically in FIG. 2, will now be set forth in detail. The biasing conditions established and set forth in Table 2 will apply to the PROGRAM, ERASE, and READ modes of operation of cell 30.

TABLE 2

MEMORY CELL 30 BIASING CONDITIONS

| | PPT | VGND | WL | VSS | PG | RPT | ERL |
|---|---|---|---|---|---|---|---|
| PRO-GRAM | Vpp − 2Vt | Vss | Vpp + Vt | Vss | 0 − Vcc | Vss | Vpp − vt |
| ERASE | Vss | Vss | Vss | Vss | 0 − Vcc | Vss | Vpp |
| READ | Vss | Vss − 0.9 | Vcc | Vss | Vcc − Vt | 2.0 | Vcc − Vt |

To program cell 30, the biasing conditions as described in Table 2 are applied to cell 30. In particular, $V_{pp}$ may be 11.5 volts, Vcc may be 5.0 volts, and Vt may be 1.3 volts. As shown most clearly in FIG. 5, floating gate 36 is charged through transistor 38 using channel hot electron programming. As shown in FIG. 6, erase line ERL is held at a value of $V_{pp}$−Vt. This "boosted" voltage applied to junction 74 improves the program coupling, by way of plate 76, as seen by the word line, or control gate 34 as shown in FIG. 5. Programming times on the order of 1 microsecond have been obtained for cell 30. This programming speed is significantly better than in conventional memory cells, such as cell 10 shown in FIG. 1. In contrast, programming of cell 10, which occurs by way of Fowler-Nordheim tunneling, requires an interval on the order of 10 milliseconds. Accordingly, the preferred memory cell embodiment 30 exhibits a 10,000:1 programming speed advantage.

During erase mode, with the biasing conditions established as described in Table 2, erasure (i.e., removal of charge from floating gate 36) occurs through erase node 32. As best shown in FIG. 6, this erasure occurs by way of tunneling of electrons from floating gate 36 through tunnel oxide 70 into junction 74.

During the read mode of operation, with the biasing conditions established as described in Table 2, cell 30 exhibits one of two predetermined responses in accordance with the preexisting charge on floating gate 36. When floating gate 36 has been programmed (i.e., "charged"), transistor 42, in response to Vcc applied by way of word line WL to control gate 34, does not turn-on. Therefore, no current flows in current path 40. In contrast, when floating gate 36 has not been programmed (i.e., not "charged"), transistor 42 will be turned-on and a read current $I_{dsr}$ will flow from RPT to VGND. As used, for example, in a programmable logic array (PLA), the VGND side of read path 40 is coupled to a bit line 58 which is furthered coupled to a current sense amplifier that continuously monitors the bit line for current flow. The sense amp is configured having a predetermined threshold, and will be triggered when the read current $I_{dsr}$ exceeds the predetermined threshold level. When the sense amplifier is triggered, its output changes state. The output state of the sense amplifier is indicative of the state of cell 30.

An important figure of merit is a so-called Q ratio, which is defined as follows:

$$Q = \frac{I_{dsr}}{\text{Capacitance}_{RPT\,line}}$$

It should be appreciated that the higher the Q ratio, the faster the memory cell may be read. In the preferred and illustrated memory cell 30, a read cell current of 440 micro amperes (at RPT=2.0 volts, and $V_G$ of transistor 42=5.0), and a Q ratio of 1.6 have been obtained. These figures of merit compare very favorably with conventional designs requiring 2x–4x the cell area.

Although cell 30, particularly the structure relating to erase node 32, may be formed in any one of a plurality of conventional methods known to those of ordinary skill in the art, preferably, the following steps are involved in constructing the erase node area 32. The first step involves forming a buried implant plate having a conductivity type opposite the substrate conductivity. Preferably, P-type silicon is used for substrate 50, and arsenic is implanted in the substrate in the tunnel area by way of implantation such that the average concentration in the doped region forming buried plate 76 is in the range of $10^{12}$ to $10^{15}$ atoms per cubic centimeter. Preferably, the concentration is $10^{12}$.

The second basic step involves forming a layer of first dielectric material over the semiconductor substrate, including a tunnel dielectric region formed over at least a portion of plate 76, such that the thickness of the tunnel dielectric is less than the thickness of the remainder of the layer of dielectric material. Preferably, the first dielectric material is silicon dioxide. The gate oxide 72 is then grown or deposited. Next, a hole is cut in the gate oxide to form the tunnel oxide region, which is grown or deposited.

The third basic step involves forming a floating gate on the layer of dielectric material using polycrystalline silicon material (hereinafter "floating poly"), including a portion extending over the tunnel oxide region 70 and plate 76. Next, the floating poly is cut, and then the next step involves forming a layer of second dielectric material on the floating poly. Preferably the interpoly dielectric used is ONO. The next basic step involves forming a control gate on the layer of ONO using polycrystalline silicon material (hereinafter "poly 2"). Next, both the floating poly and poly 2 are cut together at one time. Finally, the last basic step involves forming a buried drain region 74 in the semiconductor substrate, using a self-aligned implant technique known in the art. As shown in FIG. 6, a portion of the drain 74 is formed underneath the floating gate 36.

Figure 8:
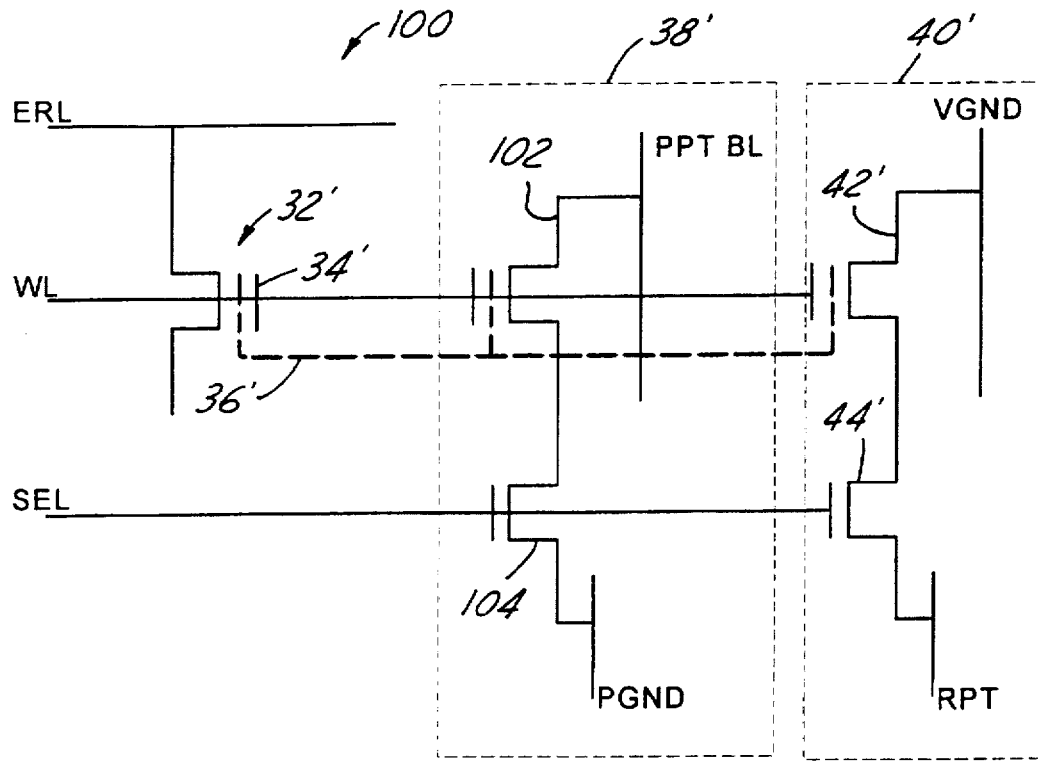
FIG. 8 is a simplified schematic diagram view of an alternative memory cell embodiment in accordance with the present invention, including particularly a program select transistor in the programming path.

Referring now to FIG. 8, an alternate embodiment memory cell 100 is depicted. Cell 100 is a 4.5 T (4 transistor/1 diode) version of the present invention, including a program select transistor 104 to avoid a program inhibit condition. As shown in FIG. 8, erase node 32' includes control gate 34' and floating gate 36'. Erase node 32' is substantially identical to erase node 32 described and illustrated in connection with the memory cell 30. Cell 100 further includes a separate programming path 38', which includes a FAMOS structure transistor 102 sharing a control gate 34' and floating gate 36' with erase node 32', and a program select transistor 104. Transistor 102 is substantially identical to the transistor 38 described and illustrated in connection with memory cell 30. Transistor 104 has been added to provide further selection/deselection capability in programming cell 100. Cell 100 further includes read path 40', including FAMOS type structure transistor 42', and pass gate 44'. Read path 40' is substantially identical to read path 40 described and illustrated in connection with memory cell 30.

The operation of cell 100 may be understood by those skilled in the are with reference to Table 3.

TABLE 3

|  | PPT | VGND | WL | PGND | SEL | RPT | ERL |
|---|---|---|---|---|---|---|---|
| PROGRAM | Vpp − 2Vt | Vss | Vpp + Vt | Vss | 0 − Vcc | Vss | Vpp − Vt |
| ERASE | Vss | Vss | Vss | Vss | 0 − Vcc | Vss | Vpp |
| READ | Vss | Vss − 0.9 | Vcc | Vss | Vcc − Vt | 2.0 | Vcc − Vt |

Figure 9:
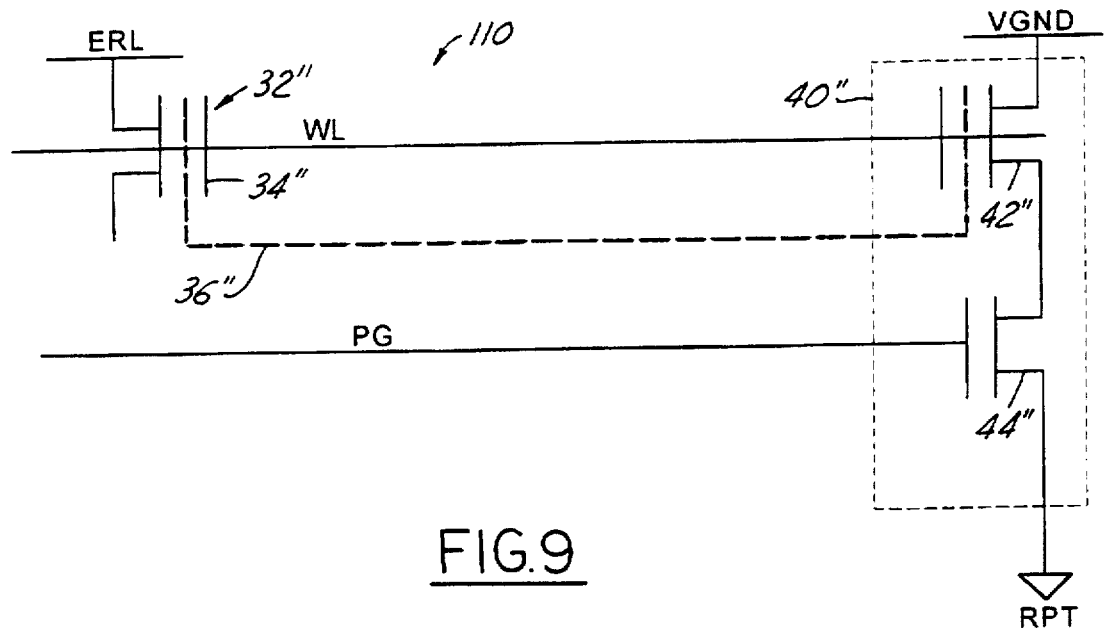
FIG. 9 is a simplified schematic diagram view of an yet another alternate memory cell embodiment of the present invention, illustrating the elimination of a separate programming path.

FIG. 9 shows yet another alternate embodiment, memory cell 110, in accordance with the present invention. Cell 110 is a 2.5 T (2 transistor/1 diode) version of the present invention. Cell 110 is substantially identical to memory cell 30 described and illustrated above except that program transistor 38 has been deleted.

Erasure occurs by way of erase node 32". A FIELDLESS, as that term has been defined herein, version of cell 110 has been fabricated having a cell area of 59 square micrometers (using 0.65 micrometer design rules), exhibits a $I_{dsr}$ of 155 micro amps, and has a Q ratio of 0.75. In a FIELD oxide version of cell 110, a cell area of 94 square microns has been realized wherein a read current of $I_{dsr}$=155 micro amps and a Q ratio of 0.32 have been obtained.

Preferably, programming occurs through transistor 42" by way of the FAMOS structure, in accordance with the biasing conditions shown in Table 4. However, programming may occur, alternatively, in cell 110 by way of tunneling through erase node 32", in accordance with the teachings of the present invention.

The operation of cell 110 may be understood by those skilled in the art with reference to Table 4.

TABLE 4

|  | VGND | WL | VSS | PG | RPT | ERL |
|---|---|---|---|---|---|---|
| PROGRAM | Vpp − 2Vt | Vpp + Vt | Vss | 0 − Vcc | Vss | Vpp − Vt |
| ERASE | Vss | Vss | Vss | 0 − Vcc | Vss | Vpp |
| READ | Vss − 0.9 | Vcc | Vss | Vcc − Vt | 2.0 | Vcc − Vt |

Figure 10:
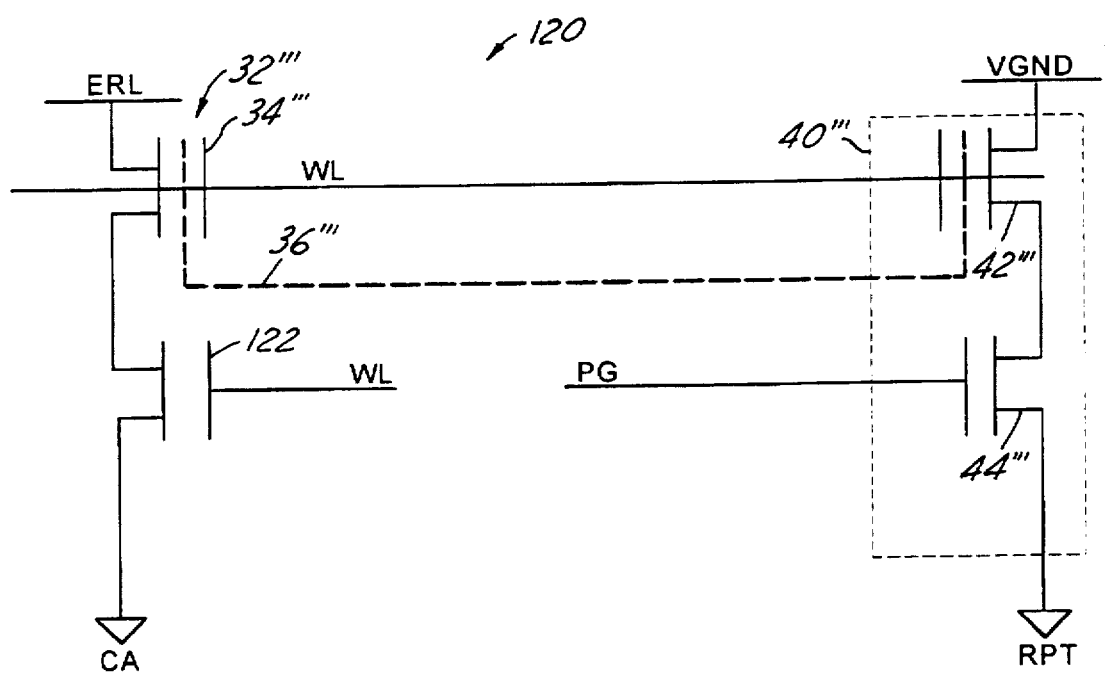
FIG. 10 is a simplified schematic view of still another alternate memory cell embodiment of the present invention, including particularly a program/erase select transistor wherein both programming and erasure occur through the Fowler-Nordheim tunneling mechanism.

FIG. 10 shows cell 120, still another alternate embodiment in accordance with the present invention. Cell 120 includes a high voltage program and erase transistor 122 coupled to erase node 32'". The particulars of cell 120 are substantially identical to that described above in connection with cell 30, except that programming and erasure occur by way of Fowler-Nordheim injection through a tunnel oxide 70'" (not shown) associated with erase node 32'".

The operation of cell 120 may be understood by those skilled in the art with reference to the following table:

TABLE 5

|  | CA | VGND | WL | PG | RPT | ERL |
|---|---|---|---|---|---|---|
| PROGRAM | Vpp | Vss | Vpp + vt | 0 − Vcc | Vss | Vss |
| ERASE | Vss | Vss | Vss | 0 − Vcc | Vss | Vpp |
| READ | Vss | Vss − 0.9 | Vcc | Vcc − Vt | 2 | Vcc − Vt |

While the invention has been particularly shown and described with reference to the preferred embodiments thereof, it is well understood by those skilled in the art that various changes and modifications can be made in the invention without departing from the spirit and scope of the invention.

We claim:

1. A non-volatile memory cell comprising:

a semiconductor substrate of a first conductivity type;

a buried implant plate having a second conductivity type opposite said first conductivity type in said substrate, said buried implant plate being configured to reduce a backbias threshold effect during programming and reading of said memory cell;

a drain region having said second conductivity type formed in said substrate adjacent to said plate coupled to an erase line having a first voltage during said programming and a second voltage during said reading, said second voltage differing from said first voltage;

a layer of dielectric material formed over said substrate, said layer of dielectric material including a tunnel dielectric region extending over at least a portion of said buried plate and said drain region, said tunnel dielectric region having a thickness that is less than the thickness of the remainder of said layer of dielectric material;

a floating gate of a first conductive material disposed on said layer of dielectric material including a portion extending over said tunnel dielectric region;

a layer of second dielectric material disposed on said floating gate; and a control gate of a second conductive material formed on said layer of second dielectric material, said erase line configured to remove charge from said floating gate through said tunnel dielectric.

2. The structure of claim 1 wherein the semiconductor substrate is P-type silicon, said drain region is buried n+ region, and said buried implant plate is doped n-type.

3. The structure of claim 2 wherein said buried implant plate comprises a doped region in said substrate having arsenic in an average concentration in the range of $10^{12}$ to $10^{15}$ atoms per cubic centimeter.

4. The structure of claim 2 wherein said layer of dielectric material is silicon dioxide, said layer of dielectric material further including a gate oxide region adjacent said tunnel dielectric region having a thickness of about 150–225 Å, said tunnel dielectric region having a thickness of about 90–110 Å.

5. The structure of claim 2 wherein said layer of dielectric material is silicon dioxide, said layer of dielectric material further including a field oxide region adjacent said tunnel dielectric region having a thickness of about 5,000 Å, said tunnel dielectric having a thickness of about 90–110 Å.

6. The structure of claim 2 wherein said floating gate comprises polycrystalline silicon.

7. The structure of claim 6 wherein said floating gate has a sheet resistance of about 80–150 ohms per square.

8. The structure of claim 2 wherein said layer of second dielectric material comprises an oxide/nitride/oxide (ONO) sandwich.

9. The structure of claim 6 wherein said control gate comprises polycrystalline silicon.

10. The structure of claim 9 wherein said control gate has a sheet resistance of about 20–40 ohms per square.

11. A memory cell for storing data having two possible states, said memory cell comprising:

a read transistor comprising (i) a floating gate chargeable to one of said two states and (ii) a control gate coupled to an input, said storage transistor having a source region and a drain region forming a first channel therebetween; and an erase node sharing said floating gate and said control gate with said read transistor, wherein said erase node removes charge from said floating gate through a tunnel dielectric, said erase node further comprising a buried implant plate below said tunnel dielectric and coupled to an erase line, said erase node being configured to reduce a backbias threshold effect during programming and reading said memory cell.

12. A memory cell for storing data having two possible states, said memory cell comprising:

a read transistor comprising (i) a floating gate chargeable to one of said two states and (ii) a control gate coupled to an input, said read transistor having a source region and a drain region forming a first channel therebetween; and an erase node sharing said floating gate and said control gate with said read transistor, said erase node configured to erase said memory cell by removing charge from said floating gate through a tunnel dielectric, said erase node further comprising a buried implant plate below said tunnel dielectric;

said buried implant plate coupled to an erase line and reducing a backbias threshold effect in response to (i) a first voltage on said erase line while programming said memory cell and (ii) a second voltage on said erase line while reading said memory cell, said first and second voltages differing from corresponding voltages on a word line coupled to said control gate by at least a threshold voltage.

13. The nonvolatile memory cell of claim 1, further comprising a word line coupled to said control gate, said word line having a voltage at least one threshold voltage higher than said erase line during said programming and said reading.

14. The nonvolatile memory cell of claim 1, wherein said first voltage corresponds to a programming voltage minus a threshold voltage, and said second voltage corresponds to an operating voltage minus a threshold voltage.

15. The nonvolatile memory cell of claim 13, wherein said first voltage corresponds to a programming voltage minus a threshold voltage, and said second voltage corresponds to an operating voltage minus a threshold voltage.

16. The nonvolatile memory cell of claim 11, further comprising a word line coupled to said control gate, said word line having a voltage at least one threshold voltage higher than said erase line during said programming and reading.

17. The nonvolatile memory cell of claim 16, wherein said first voltage corresponds to a programming voltage minus a threshold voltage, and said second voltage corresponds to an operating voltage minus a threshold voltage.

18. The nonvolatile memory cell of claim 12, wherein said first voltage corresponds to a programming voltage minus a threshold voltage, and said second voltage corresponds to an operating voltage minus a threshold voltage.

19. The nonvolatile memory cell of claim 11, further comprising a pass gate transistor coupled to said read transistor, said pass gate transistor having a source and a drain forming a channel therebetween, wherein the source, drain and channel of said read transistor and the source, drain and channel of said pass gate transistor form a read path configured to carry a current indicative of the state of the memory cell.

20. The nonvolatile memory cell of claim 12, further comprising a pass gate transistor coupled to said read transistor, said pass gate transistor having a source and a drain forming a channel therebetween, wherein the source, drain and channel of said read transistor and the source, drain and channel of said pass gate transistor form a read path configured to carry a current indicative of the state of the memory cell.

* * * * *